(12) United States Patent
Yoshizawa

(10) Patent No.: US 7,185,992 B2
(45) Date of Patent: Mar. 6, 2007

(54) LENS HOLDING TECHNIQUE

(75) Inventor: Tomoya Yoshizawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/983,698

(22) Filed: Nov. 9, 2004

(65) Prior Publication Data

US 2005/0122600 A1 Jun. 9, 2005

(30) Foreign Application Priority Data

Nov. 13, 2003 (JP) ............................ 2003-383313

(51) Int. Cl.
*G02B 7/02* (2006.01)

(52) U.S. Cl. ................... 359/513; 359/512; 359/507

(58) Field of Classification Search ............... 359/819, 359/512, 513, 507, 820; 396/25, 29
See application file for complete search history.

(56) References Cited

U.S. PATENT DOCUMENTS 3,498,695 A * 3/1970 Brouwer ............... 359/665
6,124,718 A * 9/2000 Kawata ................. 324/750
6,144,504 A * 11/2000 Sudoh et al. ........... 359/811
2002/0006687 A1 * 1/2002 Lam ..................... 438/118
2002/0097508 A1 * 7/2002 Wada et al. ............ 359/804

FOREIGN PATENT DOCUMENTS

| JP | 62-239115 | * 4/1986 |
|----|-----------|----------|
| JP | 11-14876  | 1/1999   |
| JP | 11-95078  | 4/1999   |

* cited by examiner

*Primary Examiner*—Hung Xuan Dang
*Assistant Examiner*—Joseph Martinez
(74) *Attorney, Agent, or Firm*—Fitzpatrick, Cella, Harper & Scinto

(57) ABSTRACT

A lens apparatus includes a lens unit comprising at least one lens, a holding member disposed at a side surface of the lens unit, a ring-like member disposed between the lens unit and the holding member. In the lens apparatus a fixing agent is surrounded by the lens unit, the holding member, and the ring-like member.

13 Claims, 6 Drawing Sheets

LENS HOLDING TECHNIQUE

FIELD OF THE INVENTION AND RELATED ART

The present invention relates to a lens holding technique.

As a method of mounting a lens member to a lens holding member in a lens holding apparatus, particularly a lens holding apparatus for use in a semiconductor exposure apparatus; an adhesive method in which the lens member is fixed to the lens holding member with a fixing agent, such as an adhesive, at a side surface of the lens member or a pressure ring method in which the lens member is fixed to the lens holding member by a pressure ring comprising a circular metal member has been conventionally used. Of these methods, the adhesive method has been widely employed in the lens holding apparatus used in the semiconductor exposure apparatus requiring an optical performance with high accuracy because a large stress is exerted on the lens member according to the pressure ring method.

In the adhesive method, the lens member is fixed to the lens holding member by applying an adhesive onto the side surface of the lens member, so that an adhesive is exposed to an apparatus space constituting the lens holding apparatus. Further, in the case where a cemented lens, comprising a plurality of lenses are bonded to each other with an adhesive, is held in the pressure ring method, the resultant structure is such that the adhesive is exposed at the side surface of the lens member.

With respect to the adhesive method, a conventional method improved in an adhesive has been disclosed in, e.g., Japanese Laid-Open Patent Application (JP-A) No. Hei 11-95078. In this method, as shown in FIG. 7, a lens member 101 is fixed to a holding member 102 with an adhesive 103. The adhesive is to prevent deteriorations in optical performances caused due to a generated (removed) gas component and curing of the adhesive. Further, in this document, only a brief explanation is given with respect to an adhesive structure between the lens member and the holding member according to the adhesive method.

With a finer semiconductor structure, a projection exposure apparatus is required to use a light source emitting a shorter wavelength of light. The short-wavelength light does not pass through an ordinary atmospheric air space. Further, in view of a deterioration of an optical member such as a mirror used, an exposure apparatus using extreme-ultraviolet (EUV) light is required that the entire apparatus is placed in a vacuum environment. Further, in the projection exposure apparatus, lens holding apparatuses are used in large numbers not only in a projection optical system but also in various peripheral equipment such as an alignment (positioning) microscope.

Accordingly, in such a vacuum space, by use of the conventional lens holding apparatus, degassing from the adhesive used in the lens holding apparatus is caused to occur. The removed gas causes not only contamination of the vacuum space and a lowering in degree of vacuum but also an occurrence of a clouding of the lens member by deposition of the removed gas component.

More specifically, in the adhesive structure according to the adhesive method as shown in FIG. 7, the adhesive for fixing the lens member to the holding member is exposed in an apparatus space constituting the lens holding apparatus, so that even when an adhesive containing a less amount of removed gas component is used, there arise such a problem that the vacuum space is contaminated with the removed gas or an optical deterioration such as a clouding of the lens member due to deposition with time of the removed gas component onto the lens surface is caused to occur. Further, the adhesive containing a less amount of removed gas component is generally expensive compared with an ordinary adhesive, thus being less versatility.

In view of such problems, JP-A No. Hei 11-14876 has disclosed such lens holding apparatus that a protective member is disposed at a surface of an adhesive in view of a gas component removed (generated) from the adhesive due to irradiation of an adhesive-exposed area with ultraviolet light. In the lens holding apparatus, however, the protective member is disposed for the purpose of preventing exposure of the adhesive to the ultraviolet light, so that the space wherein the adhesive is exposed to light is not completely sealed. As a result, in a vacuum environment, a removed gas component leading to a clouding at the lens surface is leaked from a gap between the lens member and the protective member.

JP-A Hei 11-14876 has further disclosed a coating method in which a surface of an adhesive is coated with a metal film and a purge method for conducting purge of an adhesive-exposed area.

However, according to the coating method, there arises such a problem that a lens performance is deteriorated by a strain caused by an increase in temperature of the lens member when the metal film is formed at a lens holding portion. Further, the purge method is accompanied with such a problem that a vacuum performance is deteriorated due to an occurrence of leakage from the lens holding apparatus particularly in a vacuum environment.

According to the above described pressure ring method, it is possible to hold the lens member without using the adhesive. However, in the case where a cemented lens comprising a plurality of lenses cemented together is held by the pressure ring method, similarly as in the case of the adhesive method, the resultant structure is such that the adhesive is exposed at a side surface of the lens since the plurality of lenses are cemented and held together in the cemented lens. Further, the kind of adhesive usable in the cemented lens is restricted in view of an influence on an optical performance of the lens. Accordingly, it is difficult to select an adhesive containing a less amount of a component to be removed as gas.

As described above, in the cemented lens, the adhesive therefor is exposed at a side surface of the cemented lens even in the case where the adhesive method is not used, so that a gas component removed from the adhesive is leaked into a vacuum space disposed in the lens holding apparatus. As a result, such a leakage can cause a lowering in degree of vacuum, a contamination of arrangement environment, a clouding of lens surface, etc.

As described above, according to the conventional lens holding apparatus, in either of the adhesive method and the pressure ring method, there arises a problem of an adverse effect by the gas removed from the fixing agent which is exposed at the side surface of the lens member. Particularly, this problem is noticeable when the lens holding apparatus is used in an environment such as a vacuum space which is increased in significance in recent years. An effective solution to this problem has not been found as yet. Even when the adhesive containing a less amount of a gas component to be removed is used, the vacuum space is still adversely affected by the removed gas component. Further, such an adhesive is expensive and has less versatility.

SUMMARY OF THE INVENTION

A principal object of the present invention is to provide a lens holding technique which reduces an adverse effect due to a gas component generated or removed from a fixing agent.

An object of the present invention is, e.g., to permit use of an inexpensive adhesive, which has been conventionally used, in a lens holding apparatus using an adhesive method, a lens holding apparatus which holds a cemented lens by a pressure ring method, etc.

Another object of the present invention is, e.g., to provide a projection exposure apparatus which provides a less amount of a gas component removed from an adhesive even in a vacuum environment, does not contaminate the vacuum environment, and does not readily cause an optical deterioration, such as a clouding of lens surface, for a long period, by use of the lens holding apparatus.

According to an aspect of the present invention, there is provided a lens apparatus, comprising:

a lens unit comprising at least one lens, a holding member disposed at a side surface of the lens unit, a ring-like member disposed between the lens unit and the holding member, wherein a fixing agent is surrounded by the lens unit, the holding member, and the ring-like member.

By use of the lens apparatus, it is possible to provide a lens holding technique which reduces an adverse effect due to a gas component removed from a fixing agent.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

In respective embodiments of the present invention described hereinafter, in the case where a lens member is fixed to a lens holding member by use of the above described lens holding apparatus, an adhesive for effecting adhesive fixing of the lens member to the lens holding member at a side surface of the lens member or an adhesive squeeze out of a side surface of a cemented lens comprising a plurality of lens members adhered to each other, is exposed. However, in the present invention, the side surface of the lens member and a lens available area are completely separated from each other in order to prevent release of gas removed from the adhesive into an environment of a lens holding apparatus when the lens holding apparatus is placed in a vacuum environment, so that a clouding of lens surface by the gas component removed from the adhesive or a deterioration of degree of vacuum in such an environment that the lens holding apparatus is placed is not caused to occur.

Figure 1:
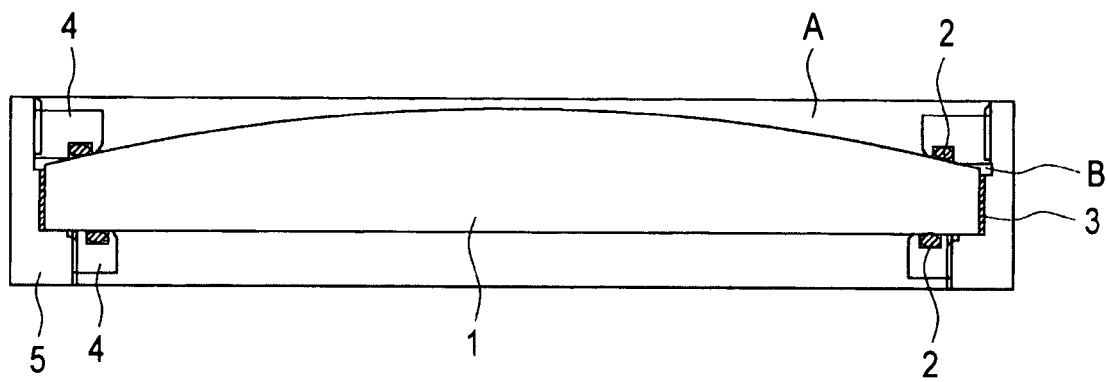
FIGS. 1–6 are schematic sectional views showing lens holding apparatuses according to first to sixth embodiments, respectively, of the present invention.

FIG. 1 is a sectional view of a lens holding apparatus according to a first embodiment of the present invention.

As shown in FIG. 1, the lens holding apparatus is constituted by fixing a lens member 1 to a lens holding member 5 with an adhesive 3. A structure of the lens holding apparatus is such that space A onto which a light beam available area of the lens member 1 faces and a space B onto which a fixing agent exposure area wherein the adhesive 3 is exposed faces are separated from each other. The adhesive 3 adheres a side surface of the lens member 1 to the lens holding member 5.

Further, the lens holding member 5 includes two pressure rings 4 for fixing the lens member 1 to the lens holding member 5 and two circular sealing members 2 each for hermetically sealing the pressure ring 4 and the lens member 1. As a result, the space B onto which the fixing agent exposure area faces is completely sealed. The sealing member 2 is elastically deformed as like an O-ring for keeping hermeticity and is disposed on a side where it supports the lens member 1. Each of the pressure rings 4 comprises a metal member and is disposed at each of both sides of the lens member 1.

According to this embodiment, it is possible to completely seal the space B onto which the fixing agent exposure area at the side surface of the lens member 1. Accordingly, even when gas is generated from the adhesive 3, the resultant gas stays in the space B surrounded by the side surface of the lens member 1 and the lens holding member 5. For this reason, it is possible to prevent the clouding of the surface of the lens member 1 by the gas in the light beam available area and the deterioration of the vacuum environment in which the lens holding apparatus is placed.

Figure 2:
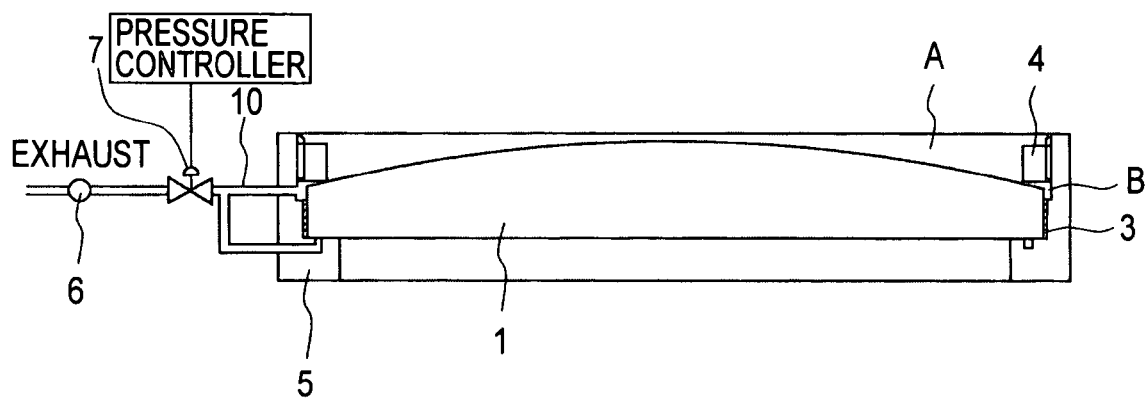

FIG. 2 is a sectional view of a lens holding apparatus according to a first embodiment of the present invention.

As shown in FIG. 2, the lens holding apparatus is constituted by fixing a lens member 1 to a lens holding member 5 with an adhesive 3. A structure of the lens holding apparatus is such that space A onto which a light beam available area of the lens member 1 faces and a space B onto which a fixing agent exposure area wherein the adhesive 3 is exposed faces are separated from each other. In order to create such a structure, the lens holding apparatus includes one pressing ring 4 for fixing the lens member 1 to the lens holding member 5. In other words, the space B separated from the space A is formed by the lens holding member 5, the side surface of the lens member 1 and the pressure ring 4. The adhesive 3 adheres a side surface of the lens member 1 to the lens holding member 5.

The lens holding member 5 includes a means for evacuating the space B onto which the fixing agent exposure area faces or a means for reducing a pressure of the space B so that it is lower than that of the space A onto which the light beam available area faces. These means includes a conduit 10 which is connected to the space B at one end and the outside at the other end, an exhaust means 6 or a pressure control means 6 disposed on the conduit 10, and a solenoid controlled valve 7 which is disposed between the exhaust or pressure control means 6 and the space B and is controlled by a pressure controller. By evacuating the gas always or as desired from the space B which is surrounded by the lens holding member 6, the side surface of the lens member 1 and the pressure ring 4 and onto which the fixing agent exposure area faces, the gas removed from the adhesive 3 used for holding the lens member 1 is exhausted out of the environment, in which the lens holding apparatus is placed, by the exhaust means 6 without being released into the environment.

Alternatively, by reducing the pressure in the space B with the pressure control means 6 so that it becomes a negative pressure, i.e., is lower than that in the lens holding apparatus placed environment, the gas removed from the adhesive 3 is exhausted out of such an environment that the lens holding apparatus is placed therein by the pressure control means 6 without being released in the environment.

Accordingly, by reducing the pressure in the space B with the pressure control means 6 so that it becomes negative pressure, i.e., is lower than that in the lens holding apparatus placed environment, the gas removed from the adhesive 3 is exhausted out of such an environment that the lens holding apparatus is placed therein by the pressure control means 6 without being released in the environment.

Accordingly, even when the adhesive 3 is used for holding the lens member 1, it is possible to prevent occurrences of a contamination of the lens holding apparatus placed environment, a deterioration of degree of vacuum, and a clouding of the surface of the lens member 1 due to deposition of the removed gas. Further, also in this embodiment, by using a sealing means such as an O-ring as in the first embodiment at a boundary portion between the lens member 1, the lens holding member 5, and the pressure ring 4, it is possible to further efficiently lower the pressure in the space B than that in the lens holding apparatus placed environment.

Figure 3:
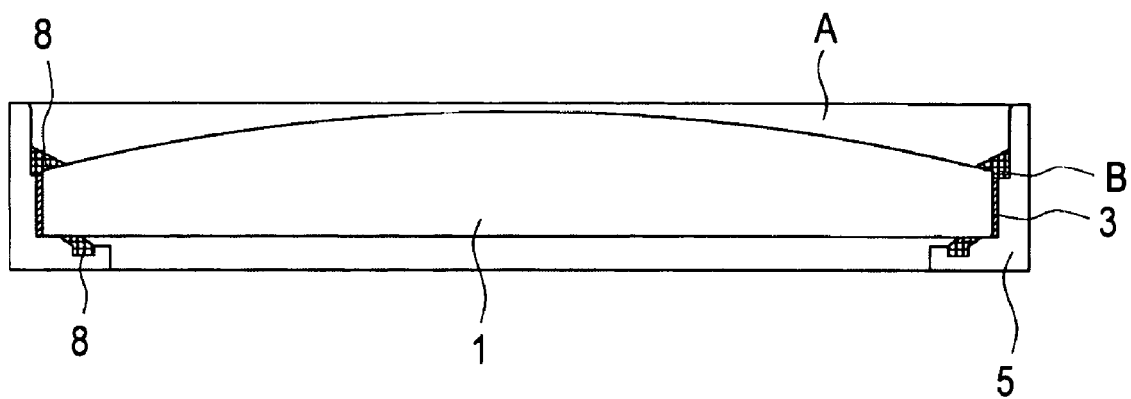

FIG. 3 is a sectional view of a lens holding apparatus according to a third embodiment of the present invention.

As shown in FIG. 3, the lens holding apparatus is constituted by fixing a lens member 1 to a lens holding member 5 with an adhesive 3. A structure of the lens holding apparatus is such that space A onto which a light beam available area of the lens member 1 faces and a space B onto which a fixing agent exposure area wherein the adhesive 3 is exposed faces are separated from each other. The adhesive 3 adheres a side surface of the lens member 1 to the lens holding member 5. In the space B, a filler 8 containing a less amount of gas component to be removed even in a vacuum, is filled.

In other words, the space B which is surrounded by the lens holding member 5 and the side surface of the lens member 1 and onto which the fixing agent exposure area faces is filled with the filler 8 so as to seal the fixing agent exposure area. Accordingly, the adhesive 3 is not directly exposed in the lens holding apparatus placed environment. For this reason, it is possible to prevent occurrences of a contamination of the lens holding apparatus placed environment, a deterioration of degree of vacuum, and a clouding of the surface of the lens member 1 due to deposition of the removed gas.

Figure 4:
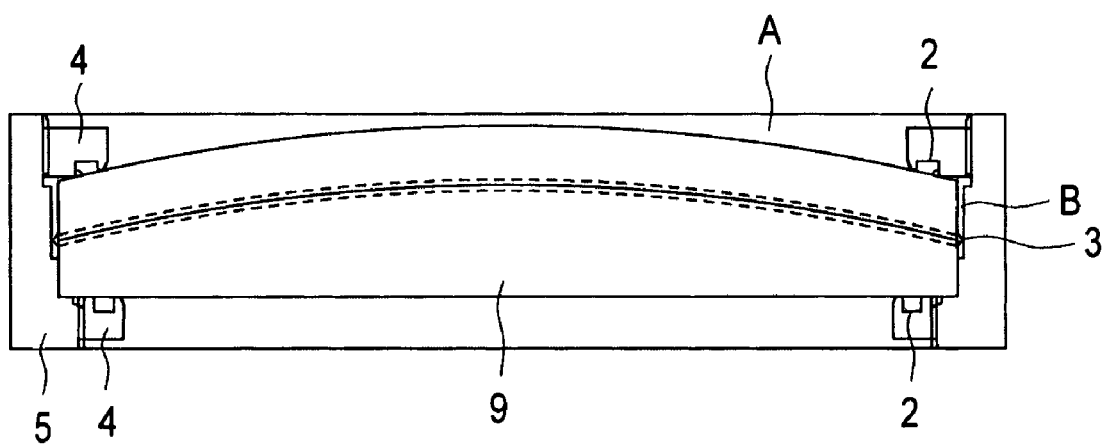

FIG. 4 is a sectional view of a lens holding apparatus according to a fourth embodiment of the present invention.

As shown in FIG. 4, the lens holding apparatus is constituted by fixing a cemented lens 9, comprising two lenses cemented to each other with an adhesive 3, to a lens holding member 5 with two pressure rings 4 each comprising a circular metal member from both surfaces of the cemented lens 9. The lens holding apparatus has such a structure that a space A onto which a light beam available area of the lens member 1 faces and a space B onto which a fixing agent exposure area faces are separated from each other. The cemented lens 9 is fixed to the lens holding member 5 by the pressure rings 4, so that an adhesive is not used for fixation between the cemented lens 9 and the lens holding member 5.

More specifically, the cemented lens 9 is prepared by cementing the plurality of lenses to each other with the adhesive 3, so that the adhesive 3 is exposed at a side surface of the cemented lens 9. For this reason, in order to hermetically seal the space B in which the adhesive 3 is spatially exposed, a sealing member 2, represented by an O-ring, which is elastically deformed to keep hermetically, is disposed at a surface on a side where the cemented lens 9 is fixed by each of the pressure ring 4. As a result, it is possible to completely seal the space B. Accordingly, even when the gas is generated from the adhesive 3, the gas remains in the space B, so that it becomes possible to prevent a surface clouding of the cemented lens 9 and a contamination of a vacuum environment in which the lens holding apparatus is placed. Further, it is not necessary to consider the gas component removed from the adhesive 3, so that an adhesive similar to a conventional adhesive can be used in the cemented lens 9.

Figure 5:
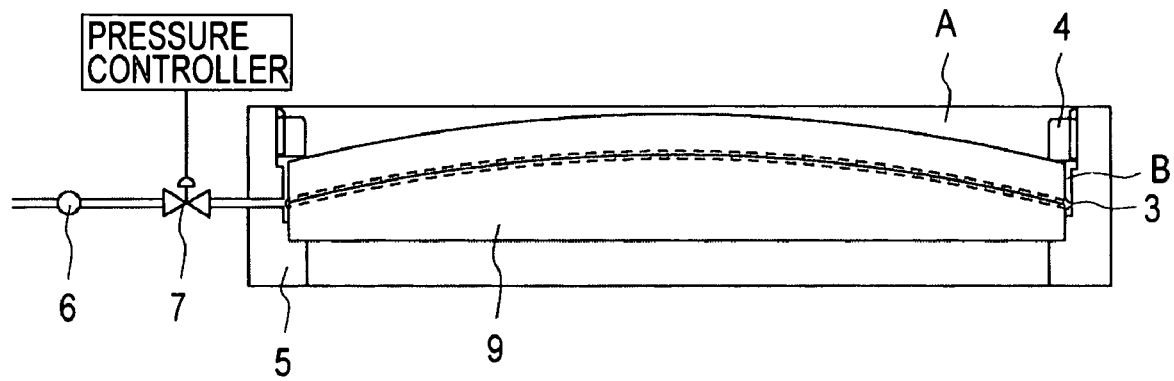

FIG. 5 is a sectional view of a lens holding apparatus according to a fifth embodiment of the present invention.

The lens holding apparatus has the same structure as that shown in FIG. 2 except that the lens member 1 is changed to a cemented lens 9. In this structure, an adhesive 3 is exposed at a side surface of the cemented lens. 9 but a space B in which the adhesive is exposed is connected to exhaust or pressure control means 6 via a solenoid (controlled) valve 7 controlled by a pressure controller. For this reason, by evacuating the gas from the space B with the exhaust means 6 or by reducing the pressure in the space B so that it becomes a negative pressure, i.e., is lower than that in the lens holding apparatus placed environment by use of the pressure control means 6, at all times or as desired, it is possible to exhaust the gas, removed from the adhesive, out of the lens holding apparatus placed environment without being released into the lens holding apparatus placed environment. As a result, even when the gas is generated and removed from the adhesive 3 exposed at the side surface of the cemented lens 9 in the space B, the gas is exhausted out of the space B, so that it is possible to prevent the surface clouding of the cemented lens 9 and the contamination of the environment in which the lens holding apparatus is placed.

Figure 6:
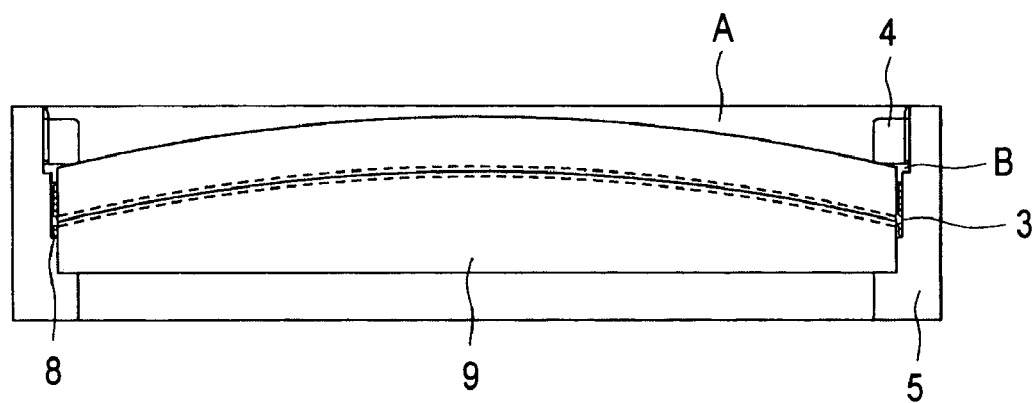
Figure 7:
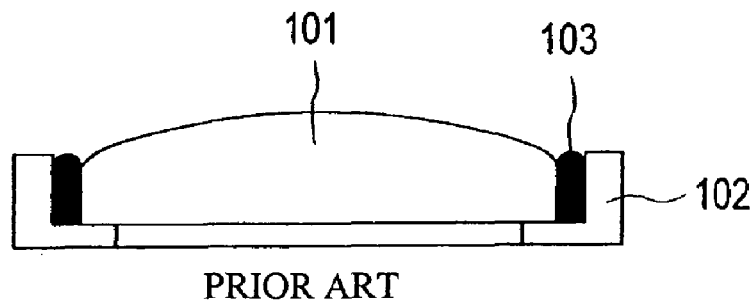
FIG. 7 is a schematic sectional view showing a conventional lens holding apparatus.

FIG. 6 is a sectional view of a lens holding apparatus according to a sixth embodiment of the present invention.

As shown in FIG. 6, the lens holding apparatus is constituted by fixing a cemented lens 9, comprising two lenses cemented to each other with an adhesive 3, to a lens holding member 5 with two pressure rings 4 each comprising a circular metal member from one surface of the cemented lens 9. The lens holding apparatus has such a structure that a space A onto which a light beam available area of the cemented lens 9 faces and a space B onto which a fixing agent exposure area faces, in which the adhesive is exposed, are separated from each other. The cemented lens 9 is fixed to the lens holding member 5 by the pressure rings 4, so that an adhesive is not used for fixation between the cemented lens 9 and the lens holding member 5. The space B is filled with a filler 8 containing a less amount of gas component to be removed even in a vacuum so as to seal the adhesive 3 exposure area. Accordingly, the adhesive 3 used in the cemented lens 9 is not directly exposed in the lens holding apparatus placed environment. For this reason, it is possible to prevent occurrences of a contamination of the lens holding apparatus placed environment, a deterioration of degree of vacuum, and a clouding of the surface of the lens member 1, due to deposition of the gas removed from the adhesive 3.

Incidentally, in the case where a cemented lens is prepared by using a plurality of lenses in combination, a necessary lens holding apparatus is constituted by using one or more structure described in the first to sixth embodiments and fixing respective lens holding members for the respective lens holding apparatuses used. With respect to a lens holding apparatus using a lens other than the cemented lens may be prepared according to at least one of the first to third embodiments, and with respect to a lens holding apparatus using the cemented lens may be prepared according to at least one of the fourth to sixth embodiments. The lens holding apparatus according to the present invention may be prepared in accordance with a combination of a plurality of the first to sixth embodiments. It is expected that a sealing performance of the gas component removed from the adhesive is further improved by using the structures of the above described various embodiments in combination.

Figure 8:
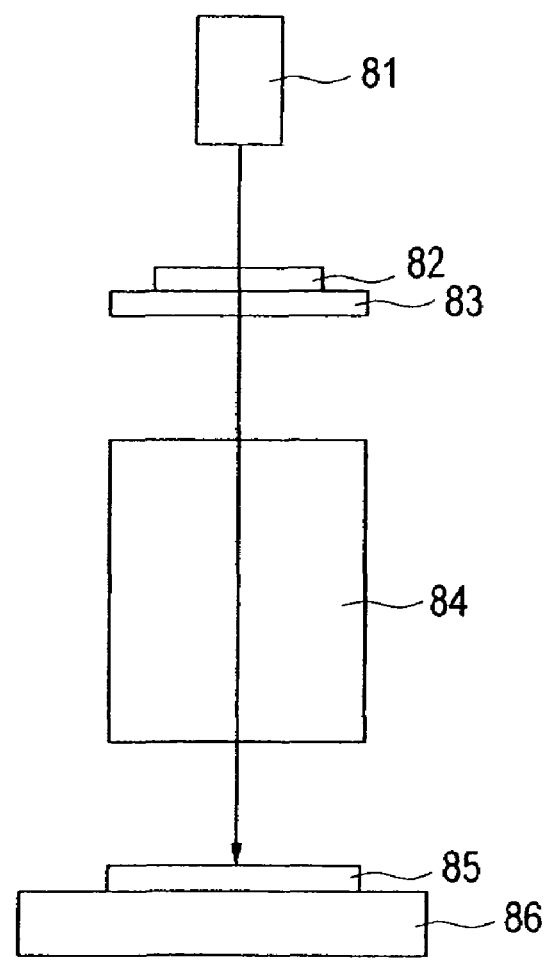
FIG. 8 is a schematic view showing a principal structure portion of a projection exposure apparatus according to an embodiment of the present invention.

FIG. 8 shows a principal structure portion of a projection exposure apparatus according to an embodiment of the present invention.

As shown in FIG. 8, the projection exposure apparatus includes: an illumination optical system 81 for emitting exposure light, a reticle 82 to be illuminated with the exposure light by the illumination optical system 81, a reticle stage 83 for positioning the reticle 82, a projection optical system 84 for projecting a pattern of the reticle 82 to be illuminated by the illumination optical system 81, a wafer 85 to be exposed to the exposure light in respective exposure areas in the pattern of the reticle 82 projected by the projection optical system 84, and a wafer stage 86 for moving the wafer 85 so that the respective exposure areas are successively positioned in an exposure range of the projection optical system 84. At least one of the illumination optical system 81 and the projection optical system 84 is placed in a vacuum environment (vacuum chamber) and is constituted by use of the above described lens holding apparatus. During the light exposure treatment, the reticle 82 and the wafer 85 are positionally aligned with each other and the pattern of the reticle 82 to be illuminated with the exposure light is exposure-transferred onto the respective exposure areas on the wafer 85 through the projection optical system 84.

Next, a device manufacturing method utilizing the exposure apparatus described above will be described.

Figure 9:
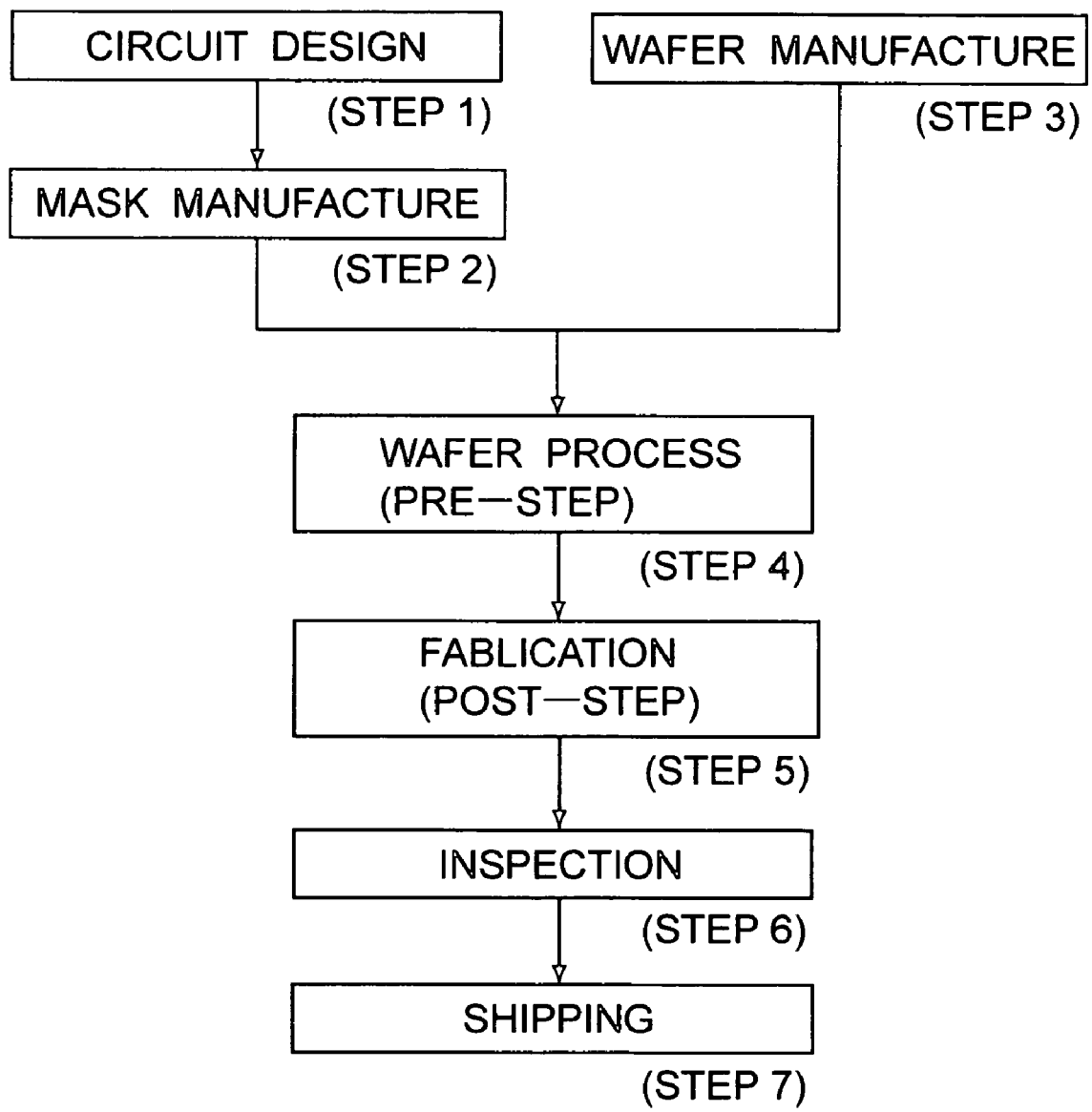
FIG. 9 is a flow chart showing a device manufacturing process.

FIG. 9 shows a flow chart of an entire manufacture process of a semiconductor device.

In Step 1 (circuit design), circuit pattern designing of the semiconductor device is performed. In Step 2 (mask manufacture), a mask provided with the designed circuit pattern is manufactured. On the other hand, in Step 3 (wafer manufacture), a wafer is manufactured by use of a material such as silicon. Step 4 (wafer process) is referred to as a pre step in which the above prepared mask and wafer are used to form an actual circuit on the wafer through lithography. A subsequent Step 5 (fabrication) is referred to as a post step in which the circuit formed wafer is fabricated in a semiconductor chip, and includes an assembly step (dicing and bonding), a packaging step (chip sealing), etc. In Step 6 (inspection), the semiconductor device fabricated in Step 5 is subjected to inspection such as operation check, durability test, etc. Through the steps described above, the semiconductor device is finished and then is shipped (Step 7). The pre-step and the post-step are separately performed in different special-purpose factories. For each factory, maintenance is carried out by a remote maintenance system. Further, between the pre-step factory and the post-step factory, data communication of information on manufacture management and apparatus maintenance is performed through the Internet or a private line network.

Figure 10:
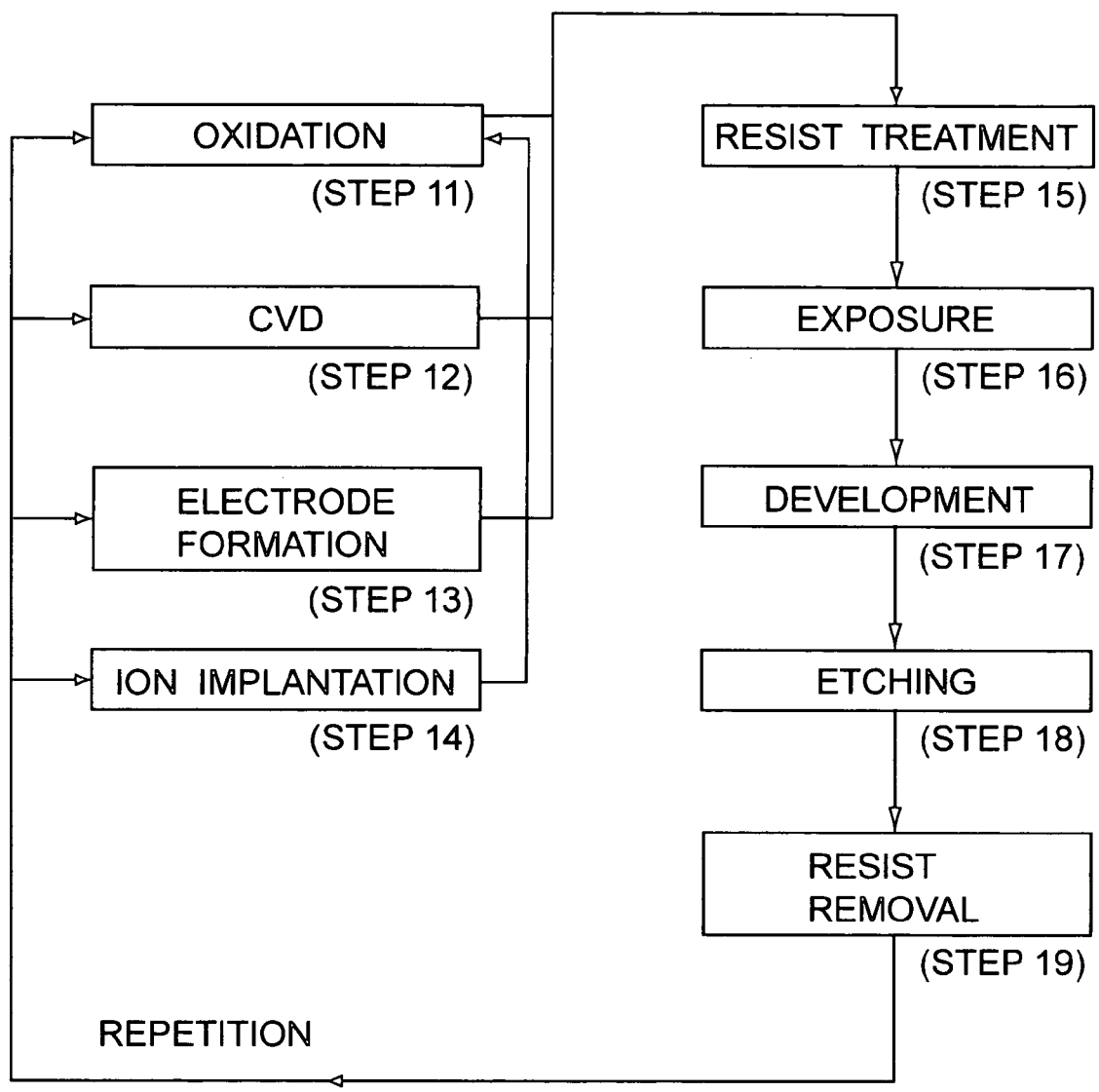
FIG. 10 is a flow chart showing a wafer process in FIG. 9.

FIG. 10 shows a flow chart of a detailed wafer step (Step 3 in FIG. 9).

In Step 11 (oxidation), the surface of wafer is oxidized. In Step 12 (CVD), an insulating film is formed on the wafer surface through CVD. In Step 13 (electrode formation), an electrode is formed on the wafer by (vacuum) vapor deposition. In Step 14 (ion implantation), ion is implanted in the wafer. In Step 15 (resist treatment), a photosensitive agent is applied onto the wafer. In Step 16 (exposure), the circuit pattern of the mask is transferred onto the wafer by pattern exposure through the above described exposure apparatus. In Step 17 (development), the exposed wafer is subjected to development. In Step 18 (etching) a portion other than the developed resist image is removed. In Step 19 (resist removal), the unnecessary resist after completion of the etching is removed. These steps are repetitively performed to form a multiply circuit pattern. Maintenance of manufacturing devices used in the respective steps is carried out by a remote maintenance system, so that it is possible to prevent trouble from occurring and even when trouble occurs, it is possible to effect quick recovery. As a result, compared with a conventional process, it is possible to improve productivity of the semiconductor device.

As described above, according to the embodiments described above, such a structure that the space onto which the light beam available area of the lens member faces and the space onto which the fixing agent exposure area, wherein the fixing agent is exposed, faces are separated from each other is employed, so that it is possible to prevent the adverse effect due to the gas component generated and removed from the fixing agent.

Further, it is possible to prevent leakage of the gas component, removed from the fixing agent, into the environment in which the lens holding apparatus is disposed, by hermetically sealing a space onto which the fixing agent exposure area faces with the O-ring etc., by exhausting the gas in the space out of the lens holding apparatus by use of the exhaust means, by lowering the pressure in the space than that in the environment in which the lens holding apparatus is disposed by use of the pressure control means, or by filling the filler so that it covers the fixing agent exposure area.

A similar effect can be attained even when the lens member is a cemented lens.

Accordingly, in the case where an optical system is constituted by disposing the lens holding apparatus in a vacuum environment, it is possible to hold the lens member similarly as in the conventional optical system without being adversely affected by the gas component removed from the fixing agent. Further, even when a cemented lens is prepared by use of a cementing adhesive from which a gas component is removable, it is possible to provide an optical system without any problem by disposing the lens holding apparatus in a vacuum environment.

Further, the gas component removed from the fixing agent is not leaked into the vacuum environment in which the lens holding apparatus is disposed, so that it is possible to eliminate the cause of phenomena such as the deterioration of the vacuum environment, the lowering in degree of vacuum, and the clouding of lens surface.

For this reason, it is possible to use a high-accuracy lens holding apparatus in such a vacuum environment that a projection exposure apparatus including a light source such as EUV light is disposed. Further, it is possible to provide a projection exposure apparatus capable of retaining a high-accuracy optical performance for a long period.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 383313/2003 filed Nov. 13, 2003, which is hereby incorporated by reference.

What is claimed is:

1. A lens apparatus, comprising:
   a lens;
   a lens holder configured to hold said lens;
   an adhesive disposed at a side surface of said lens; and
   a hermetic sealant configured to hermetically seal a space including said adhesive and surrounded by said lens and said lens holder,
   wherein said lens holder includes a holding ring configured to hold a surface of said lens via said hermetic sealant.

2. An apparatus according to claim 1, wherein said lens holder is fixed to the side surface of said lens by said adhesive.

3. An apparatus according to claim 1, wherein said lens is a cemented lens in which lenses are cemented to each other by said adhesive.

4. An apparatus according to claim 3, wherein said hermetic sealant is disposed at a side surface of said cemented lens.

5. An apparatus according to claim 1, wherein said hermetic sealant is one of an O-ring and a filler.

6. An exposure apparatus for exposing a wafer to light via a reticle, said apparatus comprising:
   a lens apparatus disposed in a path of the light, said lens apparatus comprising (a) a lens, (b) a lens holder configured to hold said lens, (c) an adhesive disposed at a side surface of said lens, and (d) a hermetic sealant configured to hermetically seal a space including said adhesive and surrounded by said lens and said lens holder.

7. An exposure apparatus according to claim 6, wherein said lens apparatus is arranged in a vacuum chamber.

8. A method of manufacturing a device, said method comprising steps of:
   exposing a wafer to light via a reticle using an exposure apparatus as defined in claim 6;
   developing the exposed wafer; and
   processing the developed wafer to manufacture the device.

9. An exposure apparatus for exposing a wafer to light via a reticle, said apparatus comprising:
   a lens apparatus disposed in a path of the light, said lens apparatus comprising (a) a lens, (b) a lens holder configured to hold said lens, (c) an adhesive disposed at a side surface of said lens, and (d) an exhauster configured to exhaust gas from a first space including said adhesive and surrounded by said lens and said lens holder, said exhauster comprising a conduit penetrating through said lens holder and being configured to exhaust gas through said conduit.

10. An apparatus according to claim 9, wherein said lens holder includes a holding ring configured to hold a surface of said lens.

11. An apparatus according to claim 9, wherein said exhauster is configured to cause pressure in the first space to be lower than that in a second space outside the first space.

12. An exposure apparatus according to claim 9, wherein said lens apparatus is arranged in a vacuum chamber.

13. A method of manufacturing a device, said method comprising steps of:
   exposing a wafer to light via a reticle using an exposure apparatus as defined in claim 9;
   developing the exposed wafer; and
   processing the developed wafer to manufacture the device.

* * * * *

UNITED STATES PATENT AND TRADEMARK OFFICE
CERTIFICATE OF CORRECTION

PATENT NO. : 7,185,992 B2  
APPLICATION NO. : 10/983698  
DATED : March 6, 2007  
INVENTOR(S) : Tomoya Yoshizawa Page 1 of 1

It is certified that error appears in the above-identified patent and that said Letters Patent is hereby corrected as shown below:

IN THE DRAWINGS:
Sheet No. 5, Figure 9, in Step 5, "FABLICATION" should read --FABRICATION--.

COLUMN 1:
Line 10, "apparatus;" should read --apparatus,--.
Line 26, "are" should read --that are--.
Line 65, "arise" should read --arises--.

COLUMN 2:
Line 5, "versatility." should read --versatile.--.

COLUMN 6:
Line 12, "ring" should read --rings--.

Signed and Sealed this

Twenty-third Day of October, 2007

JON W. DUDAS
*Director of the United States Patent and Trademark Office*